//patents.google.com/US4200810

United States Patent [19]
Cain et al.

[11] 4,200,810
[45] Apr. 29, 1980

[54] METHOD AND APPARATUS FOR AVERAGING AND STRETCHING PERIODIC SIGNALS

[75] Inventors: Gerald D. Cain, London; James E. Dilley, Leighton Buzzard; Richard C. S. Morling, London, all of England

[73] Assignee: National Research Development Corporation, London, England

[21] Appl. No.: 878,964

[22] Filed: Feb. 17, 1978

[30] Foreign Application Priority Data

Feb. 22, 1977 [GB] United Kingdom ............... 7426/77

[51] Int. Cl.$^2$ .......................... H03K 5/159; H04J 3/18
[52] U.S. Cl. ................................. 307/221 D; 328/55; 179/15.55 T; 307/293
[58] Field of Search ............. 307/221 D, 293; 328/55; 179/15.55 T

[56] References Cited

U.S. PATENT DOCUMENTS

| | | | |
|---|---|---|---|
| 3,305,785 | 2/1967 | Carroll | 179/15.55 T |
| 3,348,203 | 10/1967 | Allen | 179/15.55 T |
| 3,636,524 | 1/1972 | Holland | 179/15.55 T |
| 3,819,953 | 6/1974 | Puckette et al. | 307/221 D |
| 3,987,293 | 10/1976 | Crooke et al. | 307/221 D |
| 3,991,322 | 11/1976 | Bush et al. | 307/221 D |

*Primary Examiner*—John S. Heyman
*Attorney, Agent, or Firm*—Blanchard, Flynn, Thiel, Boutell & Tanis

[57] ABSTRACT

A digital signalling process and apparatus employing multistage charge coupled devices provides a delay structure with a multiplicity of signal paths between an input signal terminal and an output signal terminal. The signal paths impose differing delays such that when the input signal is or contains a periodic waveform whose period is in a predetermined relation to the differences between the delays in the paths, there is reinforcement of the periodic waveform. The charge coupled devices are actuated by clocking pulses and operate so as effectively to sample the reinforced signal at a rate whose period exceeds the period of the periodic waveform. As a result there appears at the output of the apparatus an averaged and time stretched version of the periodic waveform.

13 Claims, 6 Drawing Figures

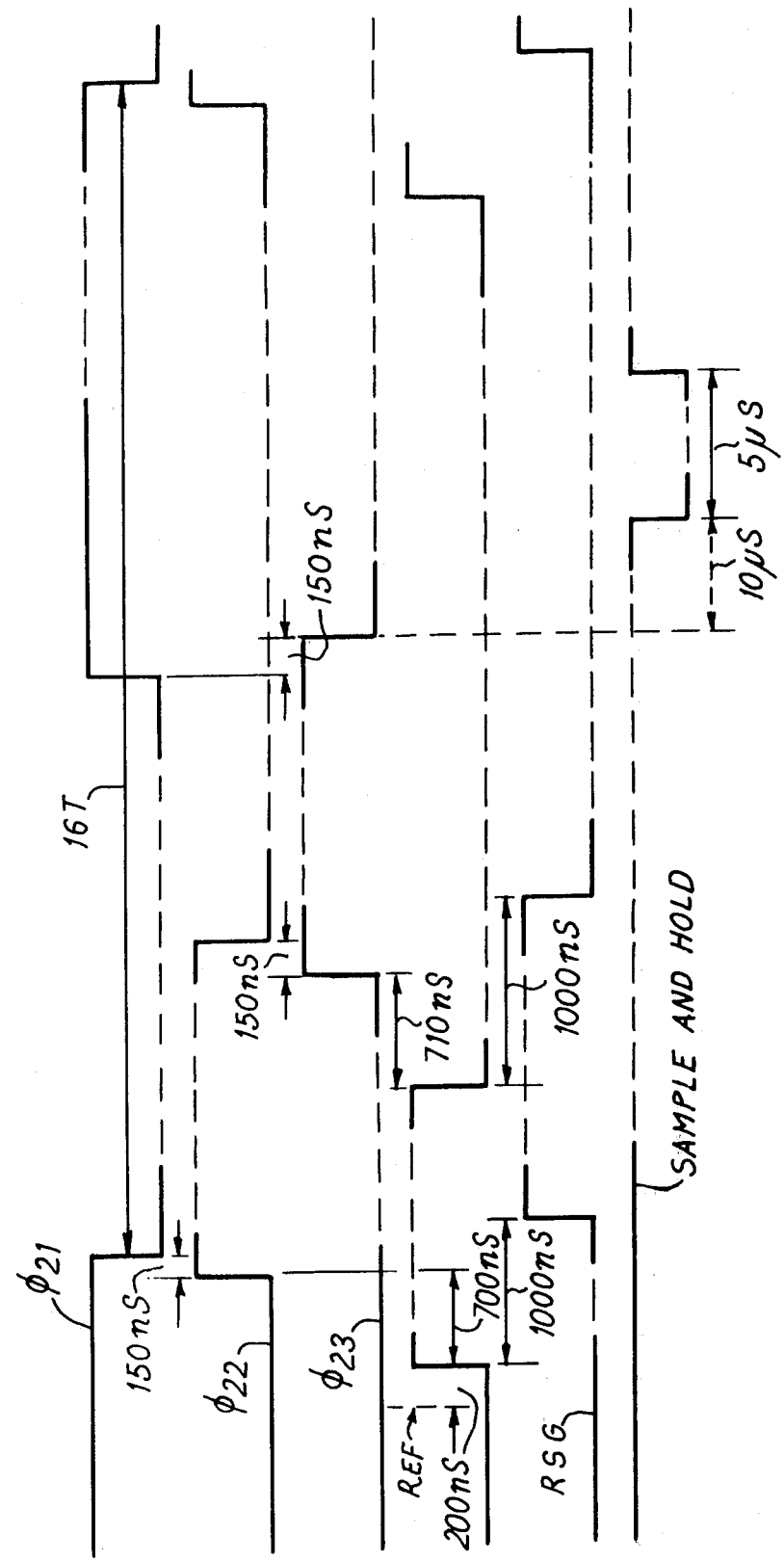

METHOD AND APPARATUS FOR AVERAGING AND STRETCHING PERIODIC SIGNALS

This invention relates to signal processing and apparatus therefor, and especially to electrical signal processing and apparatus therefor.

Two processes are involved in the invention, namely, averaging and time stretching.

Averaging of a signal is a process which improves the signal to noise ratio of a repetitive signal by superposing a number of different instances of the repeated portion of the signal, and is therefore particularly useful when the signal is periodic. Mathematically, the process of averaging a signal corresponds to the conventional mathematical operation of summing a number of values of measured quantity and dividing the resultant sum by the number of values, except that in averaging a signal there is no division by the number of different instances summed.

An example of a prior art discussion of averaging involving feedback, delay and signal addition is to be found in an article entitled "An Analysis of a Type of Comb Filter" by A. G. J. MacFarlane at pages 39 to 52 of Proceedings of the Institute of Electrical Engineers, January, 1960. A more recent discussion appeared in an article entitled "Feature Filtering: The Digital Enhancement and Suppression of Periodic Waveforms" by P. A. Lynn, at pages 220 to 221 of Electronics Letters, 31st Mar. 1977.

Time stretching of a signal is a process which results in the production of a signal which has the same values as the unstretched signal but in which each particular value of the stretched signal occurs later relative to the unstretched signal, the ratio of the times of any pair of corresponding values in the stretched and unstretched signals usually being a constant.

Time stretching techniques have been discussed in an article entitled "A digital signal processing approach to interpolation" by R. W. Schafer and L. R. Rabiner, at pages 692 to 702 of the IEEE Proceedings, Volume 61, June 1973.

A brief discussion of the present invention appears at pages 269 to 270 of Electronics Letters of 28th Apr. 1977 under the title "CCD Processor for Simultaneous Time Stretching and Signal Averaging" by G. D. Cain and R. C. S. Morling.

In carrying out the present invention, a periodic signal is both averaged and stretched, with a result which is the same as, and may actually be obtained by, averaging a periodic signal, and stretching the averaged signal. However, in a preferred embodiment of the invention, the stretching and averaging are carried out substantially together. The combination of the stretching and averaging can be effected by electronic devices which accept a new input signal value and emit a stored signal value in response to a pulse, so that such elements both act as samplers and delays, the delay being determined by the interval between successive actuating pulses. Examples of such electronic devices are charge coupled devices, and parallel input/parallel output registers.

Furthermore, in averaging in carrying out the invention, the signal values actually summed need not be actual values of the periodic signal but may be attenuated versions thereof, although the attenuation must be the same for all the summed values, and preferably there is no attenuation, the gain being unity for all the summed values.

SUMMARY OF THE INVENTION

According to one aspect of the present invention, signal processing apparatus includes means for delaying a periodic input by a plurality of different delay times, means for recombining differently delayed portions of the input, and means for sampling the said delayed portions to produce an output in the form of an averaged and time stretched representation of the said input, the said sampling means having, in operation, a sampling interval which is greater than the period of the periodic input but is not equal to a whole number multiple of the said period, and the said different delays differing by one or another whole number of periods of the said input.

Preferably the said means for recombining includes the said sampling means.

The means for delaying a periodic input preferably includes a tapped delay line.

Where the said delaying means includes a tapped line which comprises a series of devices which accept a new input signal value and emit a stored signal value in response to a pulse, the delay line must be supplied with such actuating pulses at a rate which results in input values being sampled from the periodic input at at least the Nyquist rate.

The present invention also provides a method of processing a signal containing a periodic component, the method comprising the steps of:

delaying said signal by a plurality of different delays differing from one another by a whole number multiple of the period of said periodic component;

recombining differently delayed portions of said signal arriving simultaneously at a point; and sampling said differently delayed portions at a sampling interval which is greater than the period of said periodic component.

According to another aspect of the invention, there is provided signal processing apparatus including an input terminal coupled to the input end of a tapped delay line having the taps thereof and the output end thereof each coupled to a respective sampling means which is coupled to a final output summing means, the sampling means being such as to sample at an interval which is greater than the total delay through the tapped delay line but is not equal to a whole number multiple of the said total delay, and there being further delay means such that the different signal paths from the input end of the tapped delay line to the final summing means differ from one another by whole number multiples of the total delay of the tapped delay line.

Preferably, in this other aspect of the invention, the further delay means are formed by a series of delay devices coupled to one another in the series by summing means, each such summing means having an input terminal or set of terminals coupled to a respective tap of the tapped delay, another input terminal or set of terminals coupled to the output terminal or set of terminals of one of the delay devices of the said series, and an output terminal or set of terminals coupled to the input terminal or set of terminals of the next delay device in the said series. Then, for example, where the total delay through the tapped delay line is 16T, each delay device of the said series can have a delay of 17T.

In a most preferred embodiment, the series of delay devices has a first device whose input terminal or set of terminals is coupled to the input end of the tapped delay line, the first tap of the tapped delay line being coupled to an input terminal or set of terminals of a summing means having another input terminal or set of terminals coupled to the output terminal or set of terminals of the said first delay device, and an output terminal or set of terminals coupled to the input terminal or set of terminals of the next delay device in the said series.

When an embodiment of the invention is intended to process a periodic input which in the absence of noise is a continuous function of time, and to produce therefrom a periodic output which is a continuous function of time, and the time stretching effected by the embodiment involves sampling in accordance with either of the two aspects of the invention as defined hereinbefore, the embodiment further includes interpolating means to transform the stream of discrete output values into a corresponding continuous output signal. The interpolating means may be a low-pass filter.

Several preferred embodiments of the present invention will now be described with reference to the accompanying drawings.

BRIEF DESCRIPTION OF THE DRAWINGS

FIGS. 5 and 6 are graphical representations of waveforms appearing in the embodiment of FIG. 4.

DETAILED DESCRIPTION OF THE PREFERRED EMBODIMENTS

In each of the embodiments to be described hereinafter, delay elements and delay segments of a tapped delay line are concerned and it should be understood that each such element or segment has a gain of unity.

Figure 1:
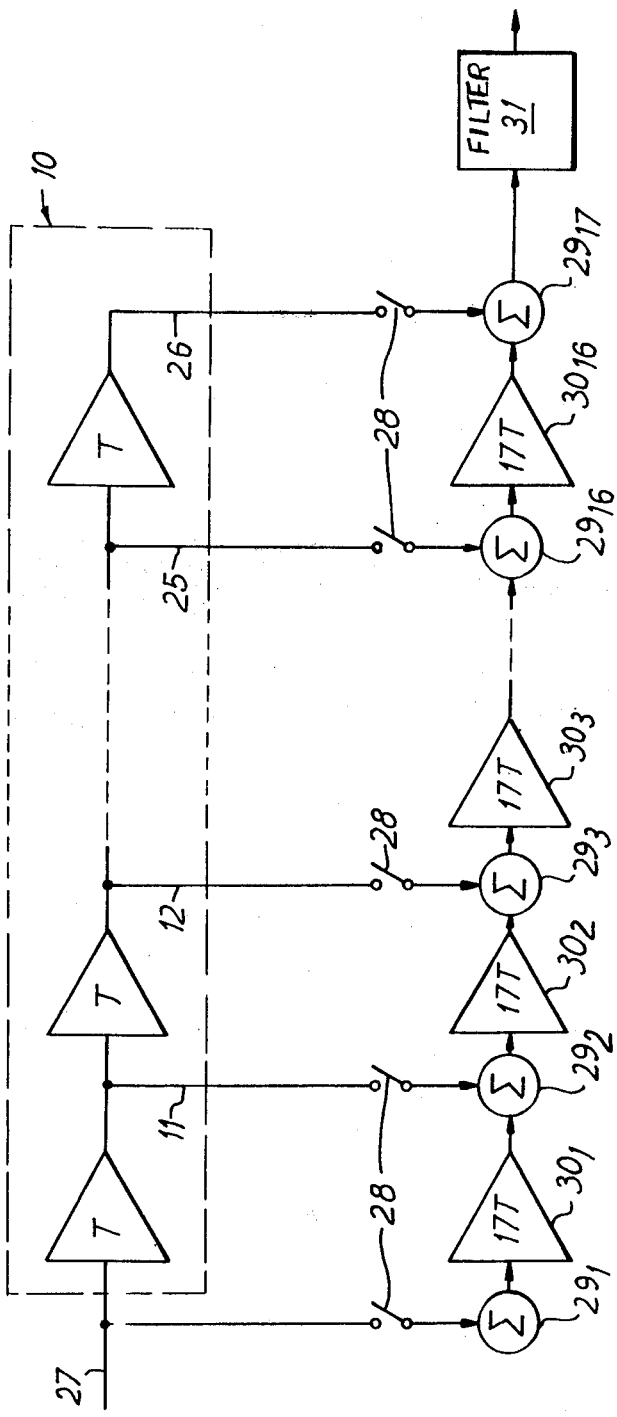
FIG. 1 is a schematic diagram of a preferred embodiment of the invention.

FIG. 1 of the drawings shows schematically a preferred embodiment of the invention. This embodiment includes a tapped delay line 10 having sixteen segments each contributing the same length of delay, T. The resultant sixteen taps 11 to 26 and also the input terminal 27 of the line 10 are connected respectively to the input terminals of seventeen sampling switches 28 whose output terminals are respectively connected to input terminals of seventeen summers $29_1$ to $29_{17}$ of which the first sixteen, $29_1$ to $29_{16}$ have their output terminals connected respectively to the input terminals of sixteen delay elements $30_1$ to $30_{16}$ each providing a delay of 17T and having its output terminals connected to an input terminal of the next following summer so that the delay elements $30_1$ to $30_{16}$ alternate with the summers $29_1$ to $29_{17}$ in a series $29_1, 30_1, 29_2, 30_2, \ldots, 29_{16}, 30_{16}, 29_{17}$. The summer $29_1$ may be omitted and the input terminal of the delay element $30_1$ be connected directly to the first sampling switch 28. The summer $29_{17}$ feeds a low pass filter 31.

The averaging effect of the embodiment will now be explained.

If the sampling switches 28 are all closed, a periodic signal supplied to the input terminal 27 can reach the output terminal of the last summer $29_{17}$ by a plurality of different paths, each subjecting the signal to a different total delay, as follows.

The path directly through the tapped delay line 10: total delay 16T.

The path through the first fifteen segments of the line 10 to the tap 25 and thence through the last delay element $20_{16}$: total delay $15T + 17T$.

The similar paths utilising respectively the taps 24 down to 11, having total delays respectively of $(14T + 2 \times 17T)$ to $(T + 15 \times 17T)$.

The path from the input terminal 27 directly through the series of delay elements $30_1$ to $30_{16}$: total delay $16 \times 17T$.

If each of these seventeen different total delays differs from all the others by whole number multiples of the period of the periodic signal supplied to the input terminal 27, there is reinforcement of the signal which is analogous to the reinforcement at a peak in an interference pattern or at the outlet of a Quinke tube adjusted to provide paths whose lengths differ by a whole number multiple of the wavelength of sound applied to the inlet.

Since this reinforcement is only true for a signal having a period by which all the delay differences between the input terminal 27 and the output terminal of the summer $29_{17}$ can be expressed in whole numbers, any noise not containing a component having such a period will be diminished in relation to the output signal. In fact, the effective gain with this embodiment for a suitable input signal is 17, as might be expected from the seventeen different paths between the input terminal 27 and the output terminal of the summer $29_{17}$.

The lowest frequency periodic signal for which reinforcement, i.e. 17-fold gain, can occur is that for which the period is equal to 16T.

To achieve stretching, in effect samples are taken of the output signal of the summer $29_{17}$ (considering for the moment that the switches 28 are replaced by direct connections) at equally spaced instants, the time interval between each pair of such samplings being slightly longer than the period of the periodic input signal, or than the period corresponding to the lowest frequency component of the periodic signal, i.e. the fundamental period, if it is not a pure sinusoid. The effect of such sampling is to produce a train of samples each taken from a respective cycle of the reinforced i.e. averaged signal but corresponding to successively later phases of the cycle so that, over a period of time equal to the product of the sampling interval and the number by which the difference between the sampling interval and the fundamental period of the input signal must be multiplied to give the fundamental period of the input signal, a complete new cycle of samples results whose values correspond to those which would result from sampling one substantially noisefree cycle of the input signal at a sampling interval equal to the aforesaid difference, assuming the phases of the first samples of the averaged and hypothetical noise-free signals to be the same. It will be seen that, for an input signal which is not a pure sinusoid, the aforesaid difference, which is in effect the sampling interval relative to the fundamental frequency of the input signal, must not be greater than the Nyquist interval, i.e. the maximum separation in time which can be given to regularly spaced instantaneous samples of the signal for complete determination of the waveform of the signal. The Nyquist interval is known to be equal to 1/(2W) where W is the bandwidth of the signal in question.

In the present embodiment, the sampling is actually carried out by means of the seventeen switches 28 which are situated between the delay line 10 and the summers $29_1$ to $29_{17}$. Consequently, the actual sampling interval, i.e. the interval between successive closings of the switches 28, is limited to that which ensures coincidence of the signals supplied to the summers $29_2$ to $29_{17}$. Thus the interval is chosen to be 17T in this particular example. The embodiment by its having the delay line 10 with a delay 16T selects the fundamental period of input signal for reinforcement, i.e. averaging at 16T. The actual sampling interval is 17T and the effective sampling interval is T. Thus a Nyquist interval of T is imposed with the result that for complete reproduction of the waveform of the input signal in the stretched and averaged output signal, the bandwidth of the input signal must not exceed 1/(2T). Regarding the input signal as a complex function of frequency, this bandwidth corresponds to a frequency interval for the complex function of −1/(2T) to +1/(2T).

Since the actual sampling interval is 17T, and the number by which the aforesaid difference must be multiplied to result in the fundamental input signal period is 16, then the fundamental output signal period is 17×16T, i.e. seventeen times the fundamental input period. Thus the stretching is seventeenfold. The frequency interval of the complex output signal is from −1/(34T) to +1/(34T) after passing through the low pass filter 31.

In the preferred form, the embodiment of FIG. 1 utilises charge coupled devices which may be referred to as CCDs to implement the structure of the embodiment, the delay line 10 being a tapped charge-coupled delay-line to which clock pulses at a rate 1/T are supplied to effect the transfer of sample input signal values from one tap to the next, and the switches 28 together with the summers $29_1$ to $29_{16}$ and the delay elements $30_1$ to $30_{16}$ being comprised by a time delay and integrate CCD described at pages 315 to 325 of the proceedings of the 3rd International Conference on the Technology and Applications of Charge Coupled Devices held in September 1976 at the University of Edinburgh, which constitute an article entitled A Time Delay and Integration CCD by G. F. Vanstone, J. G. Harpe, J. M. Keen, D. V. McCaughan and D. B. Webb. This device does not physically include the switches 28 but instead is supplied with clock pulses at a rate of 1/(17T) to shift the respective signals stored in each of the delay elements $30_1$ to $30_{16}$ to the next element or the summer $29_{17}$. Thus in effect the switching of sixteen of the switches 28 is carried out. The summer $29_{17}$ is a separate conventional device having its two input terminals connected to the output terminals of the charge-coupled delay-line and the time delay and integration CCD. The two sets of clock pulses must of course by synchronised. Furthermore, in practice the switch 28 to which the tap 26 is connected would be replaced by a direct connection, and the low pass filter 31 replaced by a sample and hold circuit followed by a low pass filter. The sample and hold circuit would be supplied with a synchronising signal to ensure that it sampled in synchronism with switches 28 i.e. with the time delay and integrate CCD.

An entirely digital form of the embodiment of FIG. 1 can be made by replacing the delay segments of the line 10 with sixteen parallel coupled registers whose contents are shifted by clock pulses, supplied at the rate 1/T, from one register to the next at each pulse, using digital summers for the summers $29_1$ to $29_{17}$, and replacing the delay elements $30_1$ to $30_{16}$ with a further sixteen registers, of suitable capacity, and supplied with clock pulses at the rate 1/(17T) to shift the contents of each of the registers $30_1$ to $30_{16}$ through the subsequent summer. An analog-to-digital converter adapted to sample an analog signal at the rate 1/T in phase with the shifting of the contents of the two sets of registers may be added to replace the input terminal 27, and a digital-to-analog converter is coupled between the output of the final summer $29_{17}$ and the filter 31.

Furthermore, when the line 10 is in the form of a plurality of stores whose contents are replaced in response to clock pulses, each such store providing a delay T may consist itself of more than one storage device or element so that, for example, three clock pulses may be required to shift signal values from the input terminal(s) to the output terminal(s) of each store, T being equal to three clock periods. The delay elements $30_1$ to $30_{16}$ may likewise be such as to require, for example, fifty-one such clock pulses. Furthermore in a digital embodiment each of the summers 29 to $29_{17}$ is preferably such as to establish at its output terminals the sum of the two numbers presented to its two sets of input terminals immediately, so that all that is required for this sum to be supplied to the next delay element or, in the case of the summer $29_{17}$, to the digital-to-analog converter is the simultaneous occurrence of the output numbers of the respective segment of the line 10 and the preceding one of the elements $30_1$ to $30_{16}$ coupled thereto.

In its digital and CCD forms, the embodiment of FIG. 1 operates in a discrete time mode, that is to say, at the input terminal 27 all input signal values which may be present in continuous time are ignored except those which occur at the discrete instants of time which can be described by the series kT where k takes all positive and negative whole number values. Thus at the input terminal 27, the input is describable by s(kT)+n(kT) where s is the signal and n is the accompanying noise, or more generally, s is the wanted input and n is the unwanted input. The output signal at the output terminal(s) of the final summer $29_{17}$ can be described by y(kT) wherein the values of k are limited to zero and the positive and negative whole number multiples of 17. More formally, $$y(kT) = \begin{cases} y(l17T) \text{ where } l = \ldots -1, 0, 1, 2, \ldots \\ o \text{ where } k \neq 17l. \end{cases} \quad (1)$$

As mentioned hereinbefore, the switching of the switches 28 can be regarded as a sampling at intervals of 17T of an averaged signal produced by replacing the switches 28 with direct connections. The embodiment of FIG. 1 may then be regarded as a linear time-invariant black box coupled by a single sampling switch operating at the sampling interval 17T to the filter 31. Let the transfer function of this black box be H in terms of the Z-transform explained in Theory and Applications of Digital Signal Processing by L. R. Rabiner and B. Gold, published by Prentice-Hall of Englewood Cliffs, New Jersey, U.S.A., in 1975. Then $$H(Z) = (Z^{-17})^{16} + (Z^{-17})^{16} \sum_{m=1}^{15} Z^{16m} + Z^{-16} \quad (2)$$

The latter expression can be shown to give $$H(Z) = (Z^{-17})^{16} \left[ \frac{(Z^{16})^{17} - 1}{Z^{16} - 1} \right] \quad (3)$$

Substitution for the Z operator to obtain the transfer function in terms of a complex periodical operator gives $$H(e^{j2\pi fT}) = e^{-j2\pi fT(16)(9)} \frac{\sin(16 \times 17)\pi fT}{\sin 16\pi fT} \quad (4)$$

Equation (4) shows that the black box has the transfer function of a linear phase filter having a delay, in samples, of $16 \times 9 = 144$ and a gain magnitude of $$\left| \frac{\sin 16 \times 17\pi fT}{\sin 16\pi fT} \right|$$

i.e. a peak gain magnitude of 17.

Assuming that the noise sequence $n(kT)$ entering at the input terminal 27, is uncorrelated from member to member of the sequence $n(kT)$ and is contained within the complex spectral limits $-\frac{1}{2}T$ and $+\frac{1}{2}T$ of the wanted signal, it will be seen that the noise is bandlimited white noise and can reach the output terminal of the black box by seventeen different delay paths. Thus each member of the sequence $n(kT)$ presents itself seventeen different times to the actual sampling process with the sampling interval 17T. Since the noise in each member is white and uncorrelated from one member to any other, and seventeen different members arrive simultaneously at the output terminal of the black box, only the power values of the noise sequence members sum, so that the noise output power of the black box is 17 times the noise input power. This is in contrast to the gain for the wanted signal which is an amplitude gain of 17 times, and therefore a power gain of $(17)^2$ times. Thus the signal-to-noise ratio is improved from input to output of the black box by a factor of 17.

In formal terms, the operation of the sampling of 17T intervals after the black box can be described by a sampler which, when receiving an input signal spectrum $\underline{Y}(e^{j2\pi fT})$, produces an output signal spectrum $Y(e^{j2\pi fT'})$ where $T' = 17T$ and $$Y(e^{j2\pi fT'}) = \frac{1}{17} \sum_{q=0}^{16} \underline{Y}\left(e^{j2\pi T[f - \frac{q}{17T}]}\right) \quad (5)$$

By way of example, it is assumed that the input supplied to the terminal 27 is a continuous time signal $s(t)$, where t is the independent continuous time variable, together with noise $n(t)$. The signal $s(t)$ gives rise to a periodic signal sequence $s(kT)$ which, it is assumed, contains no frequencies above $\frac{1}{2}T$. and can be further assumed to consist of seventeen discrete spectral lines in the complex frequency range corresponding to frequency, f being equal to $-1(2T), -7/(16T), \ldots, 0, +1/(16T), \ldots, +7/(16T), +1/(2T)$, i.e. zero frequency and the first eight harmonics with $1/(16T)$ as fundamental. The signal sequence $s(kT)$ can be described by the spectrum function $S(e^{j2\pi f_r T})$, and since $s(kT)$ is real valued, $$S_r^* = S_{-r} \quad (6)$$

where r is a whole number, and where $f_r = r/16T$ and $S_r$ is the spectral line strength at $S(e^{j2\pi f_r T})$.

Considering the signal sequence $S(e^{j2\pi f_r T})$ alone, the black box gives an output signal $$\underline{Y}_s(e^{j2\pi fT}) = H(e^{j2\pi fT})S(e^{j2\pi f_r T}) \quad (7)$$

Consequently there appears, as a result of the operation of sampling this output signal at 17T intervals, a final output signal $Y_s(e^{j2\pi fT'})$ which is given by $$Y_s(e^{j2\pi fT'}) = \quad (8)$$

$$\frac{1}{17} \sum_{q=0}^{16} H\left(e^{j2\pi T[f - \frac{q}{17T}]}\right) S\left(e^{j2\pi T[f - \frac{q}{17T}]}\right)$$

The continuous time periodic signal from which the signal sequence $s(kT)$ is obtained is described by $s(t)$, where $$s(t) = \sum_{r=-8}^{8} S_r e^{\frac{j2\pi rt}{16T}} \quad (9)$$

From equation (4),
$$H(e^{j2\pi f_r T}) = 17 e^{-j2\pi r \cdot 9} \quad (10)$$

Hence the corresponding continuous time output signal from the black box is given by $$\underline{y}_s(t) = 17 \sum_{r=-8}^{8} S_r \cdot e^{-j2\pi r \cdot 9} e^{\frac{j2\pi rt}{16T}} \quad (11)$$

$$= \sum_{r=-8}^{8} C_r e^{\frac{j2\pi rt}{16T}}$$

by writing a coefficient $C_r$ for each $17 S_r e^{-j2\pi r \cdot 9}$.

From equation (5) the effect of the operation of sampling at 17T intervals can now be seen to result in a function $$y(t)_{17T} = \frac{1}{17} \sum_{q=0}^{16} \sum_{r=-8}^{8} C_r e^{j2\pi t(f_r - \frac{q}{17T})} \quad (12)$$

Since $$[f_r - q/(17T)] = \frac{17r - 16q}{272T} \quad (13)$$

the function $y(t)_{17T}$ shows the stretching to a period 272T which is seventeen times the original period. Furthermore, the coefficients $C_r$ show that the spectral lines of the function $y(t)_{17T}$ have an amplitude gain of unity relative to the lines $S_r$, and that each is subject to a delay of 9 periods, i.e. 144T, relative to $s(t)$. The unity gain relative to the lines $S_r$ in fact represents an improvement in gain by a factor of 17 over what would be achieved if the input signal $s(t)$ were merely stretched to fit a new fundamental period of 17T without the benefit of the averaging effected by the black box.

The effect of the embodiment on the noise sequence $n(kT)$ can be described as follows:

The noise is bandlimited white noise having a power spectral density $$P_N T \text{ rect } (f/(1/T))$$

where $P_N$ is a coefficient, and rect $(f/(1/T))$ is the rectangular function of f in the range $-1/(2T)$ to $+1/(2T)$.

The black box transforms the above power spectral density into $$\Phi_{N1}(f) = P_N T \left[ \frac{\sin(17)(16)fT}{\sin 16 fT} \right]^2 rect\left(\frac{f}{1/T}\right)$$

The final sampling at intervals of 17T followed by the limiting effect of the filter 31 transform this last expression into $$\left[ \sum_{q=-\infty}^{\infty} \Phi_{N1}\left(f - \frac{q}{17T}\right) \right] rect\left[ \frac{f}{1/(17T)} \right].$$

It will be seen from the presence of the term rect f/(1/(17T)) that the output spectrum of noise from the filter 31 is limited to the complex frequency range [−1/(34T), +1/(34T)] which is 1/17th of the input range [−1/(2T), +1/(27T)]. The filter 31 is constructed to effect this limitation of frequency range. The ratio of the sampling rate 17T to the rate of appearance of samples of the input s(kT)+n(kT) is 17. Hence the change in the range of frequency from input to output is in inverse proportion to the change in the sample rate. This relationship between the change in range of frequency and change in sample rate is necessary to ensure that the noise power is not affected by the sampling at intervals of 17T, and is discussed in Signals and Noise in Communication Systems by H. E. Rowe, published in 1965 by Van Nostrand at Princeton, New Jersey, U.S.A., especially at page 254.

In a purely digital implementation of the line 10 and the summers 29 and delay elements 30, the digital-to-analog converter (not shown) inserted between the final summer 29$_{17}$ and the filter 31 may contribute to the limitation of frequency range so that the filter 31 need do no more than complete the overall output frequency limiting to bring the combined limiting effect of the converter and the filter 31 to inverse proportional relationship with the change in sample rate.

For an embodiment as described with reference to FIG. 1 but having N segments of delay T in the line 10, each delay element 30 having a delay of (N+1)T and the sampling switches 28 operating at intervals of (N+1)T, the transfer function H is given by $$H(e^{j2\pi fT}) = e^{-j2\pi fT(N)[N/2 + 1]} \frac{\sin (N)(N+1)\pi fT}{\sin N\pi fT} \quad (14)$$

which shows that there is a peak gain magnitude of (N+1) and a delay, in samples, of (N)(N/2+1) where N is the number of delay segments of delay T. The signal to noise ratio is improvement in the ratio (N+1):1.

In some cases it may be necessary to electrically buffer the input end of the delay line 10 and the output end of the series of alternate summers 29 and delay elements 30. This may be carried out for example by having an additional delay segment of delay T at the input terminal 27 to feed the line 10 and the summer 29$_1$, and an additional delay element 30 to couple the final summer 29 to the filter 31. In the general case these features result in the delay in samples being increased to (N+1)²/2 where N is the number of delay segments of delay T. Hence if the embodiment of FIG. 1 were buffered by the provision of a delay segment of delay T at the terminal 27 and a delay element of delay 17T between the summer 29$_{17}$ and the filter 31, the delay in samples at the final output terminal of the filter 31 would be 289÷2=144½.

Figure 2:
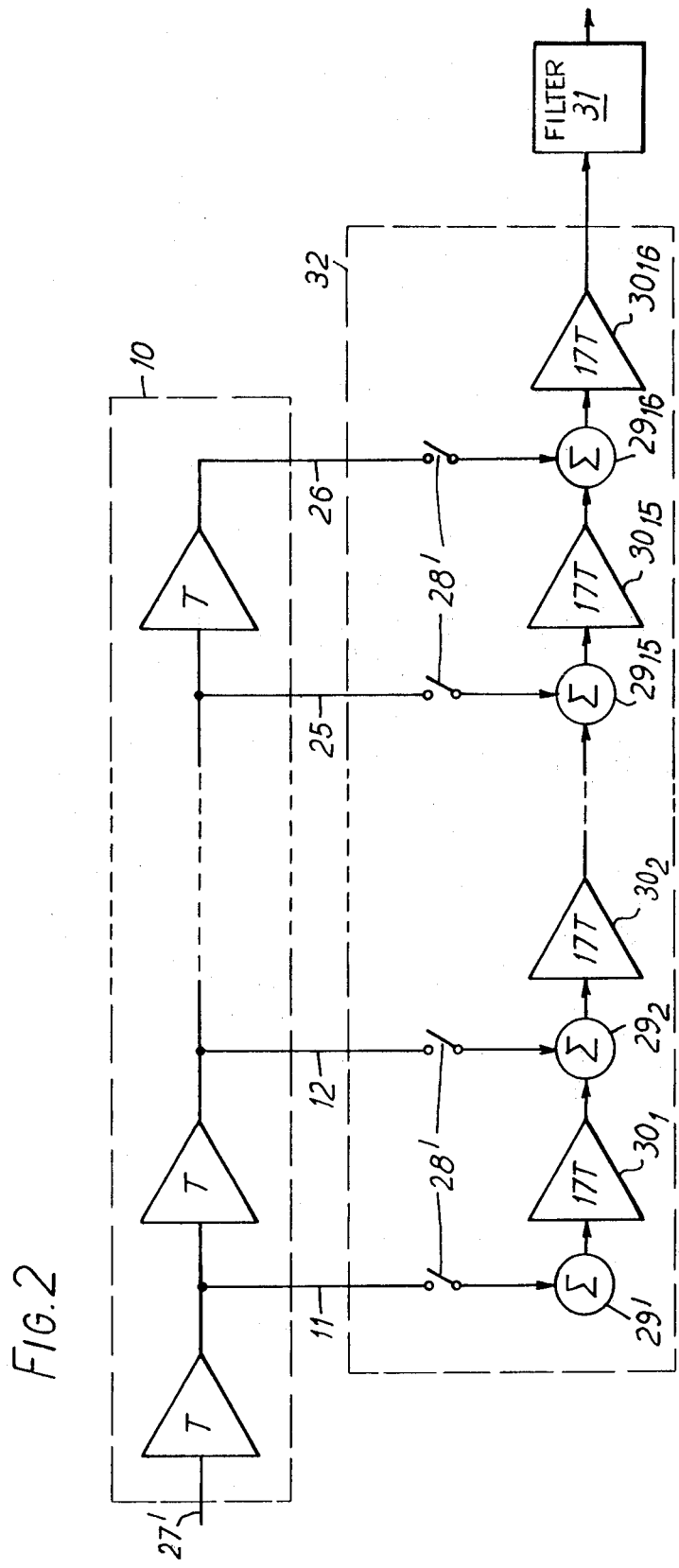
FIG. 2 is a schematic diagram of another embodiment of the invention.

An alternate embodiment providing buffering but requiring only the same numbers of delay segments of delay T and delay elements of delay 17T as FIG. 1 can be constructed as shown in FIG. 2. However, the embodiment of FIG. 2 does not provide the same amount of noise reduction as that of FIG. 1 and is also more vulnerable to interference by unwanted periodic disturbances. Items which are the same in the two FIGS. 1 and 2 have the same reference numerals.

It will be seen that sixteen switches 28′ replace the seventeen switches 28 of FIG. 1, and that the input terminal 27′ is connected only to the input end of the delay line 10, the sixteen taps 11 to 26 of which are connected to the sixteen sampling switches 28′ incorporated in a sixteen stage time delay and integrate block 32 constituted by the alternate summers 29$_1$ to 29$_{16}$ and delay elements 30$_1$ to 30$_{16}$. There are consequently only sixteen delay paths to take into account and the resultant peak gain magnitude for an input signal whose fundamental period is 16T is 16, i.e. one less than in the embodiment of FIG. 1. In this respect the embodiment of FIG. 2 corresponds to a simple buffered embodiment having a delay line 10 consisting of fifteen delay segments of delay T coupled through sixteen sampling switches and summers to sixteen delay elements of delay 16T.

The sampling switches 28′ sample simultaneously at intervals of 17T synchronised with the movement of the contents of the delay elements 30$_1$ to 30$_{15}$ to the delay elements 30$_2$ to 30$_{16}$ and with a movement of the contents of the segments of the delay line 10.

If the switches 28′ are closed, the line 10 and block 32 can be treated as a linear time-invariant black box having a Z transfer function given by $$H'(Z) = (Z^{-17})^{17} \sum_{n=1}^{16} Z^{16n} \quad (15)$$

which, in terms of the complex operator $e^{j2\pi fT}$ is given by $$H'(e^{j2\pi fT}) = e^{-j2\pi fT(17)} \left[ \frac{16}{2} + 1 \right] \frac{\sin 16^2 \pi fT}{\sin 16\pi fT} \quad (16)$$

Hence the black box in this case has a transfer function of a linear phase filter with a delay in samples of 153 and a gain magnitude of $$\left| \frac{\sin 256 \pi fT}{\sin 16\pi fT} \right|,$$

i.e. a peak of 16. Assuming again that the input signal s(t) to be applied to the input terminal 27′ is limited to the complex frequency range [−1/(2T),+1/(2T)] and contains only the harmonics defined by the equation $f_r = r/16T$ where r=−8, −7, . . . , 0, 1, . . . , 8, then equation (16) leads to $$H'(e^{j2\pi f_r T}) \cdot S(e^{j2\pi f_r T}) = 16 \cdot S_r e^{-j2r\pi \cdot (9.5625)} \quad (17)$$

where $S_r$ again represents the spectral line strength at $f_r$.

Since the switches 28′ are operated at intervals of 17T, equation (5) again represents the sampling operation. However, the continuous time output signal from the black box would now be $$y_s'(t) = 16 \sum_{r=-8}^{8} S_r \cdot e^{-j2\pi r \cdot (9.5625)} \cdot e^{\frac{j2\pi rt}{16T}} \quad (18)$$

$$= \sum_{r=-8}^{8} C_r' \cdot e^{\frac{j2\pi rt}{16T}}$$

writing a coefficient $C_r'$ for each $16 \, S_r \cdot e^{-j2\pi r \cdot (9.5625)}$ From equation (5) the effect of the operation of sampling at 17T intervals can now be seen to result in function $$y_s'(t)_{17T} = \frac{1}{17} \sum_{q=0}^{16} \sum_{r=-8}^{8} C_r' \cdot e^{j2\pi t(f_r - \frac{q}{17T})} \quad (19)$$

From equation (13) the stretching is to a period 272T which is seventeen times the original period. The coefficients $C_r'$ show that there is a 9.5625 period delay relative to the continuous time input signal s(t), and an amplitude scaling of (×16) followed by the usual 1/17 scaling as a result of the sampling operation. The output sample stream can therefore be represented by $$\{y(l17T)\} = 16\{S[(l-153)T]\} \quad (20)$$

which may be compared with the corresponding equation for the embodiment of FIG. 1 which is:

$$\{y(l17T)\} = 17\{S[(l-144)T]\} \quad (21)$$

The noise sequence n(kT) accepted at the input terminal 27' from the continuous noise function n(t) is assumed to be limited to the range $[-\frac{1}{2}T, +\frac{1}{2}T]$ and of total power $P_N$. The power spectral density of the noise can then be again given by $$P_N T \, \text{rect}\, (f/(1/T))$$

For the embodiment of FIG. 2, the black box transforms the above density into $$\Phi'_{NI}(f) = P_N T \left[ \frac{\sin 16^2 \pi fT}{\sin 16 \pi fT} \right]^2 \text{rect}\left(\frac{f}{1/T}\right)$$

Each noise sample at the terminal 27' presents itself to the final sampling operation sixteen different times by virtue of the sixteen different delay paths through the black box. Since each noise sample is uncorrelated with all the other noise samples, the powers of sixteen different noise samples add at the output of the black box and the total noise power there is $16 \, P_N$.

The effect of the final sampling at intervals of 17T followed by the limiting effect of the filter 31 is again $$\left[ \sum_{q=-\infty}^{\infty} \Phi_{NI}' \left( f - \frac{q}{17T} \right) \right] \text{rect}\left[ \frac{f}{1(17T)} \right].$$

Equations corresponding to equations (16) and (20) but for an embodiment having N segments of the delay line 10 and N delay elements 30 are $$H'(e^{j2\pi fT}) = e^{-j2\pi fT(N+1)\,[N/2+1]} \frac{\sin N^2 \pi fT}{\sin N\pi fT} \quad (22)$$

$$\{y[l(N+1)T]\} = N\left\{ s\left[\left(l - \frac{(N+1)(N+2)}{2}\right)T\right]\right\} \quad (23)$$

and the signal-to-noise ratio at the output is N.

Comparing equations (4) and (16) it will be seen that the expression for the gain magnitude (sin $(16)-(17)\cdot\pi fT/\sin 16\pi fT$) in equation (4) imposes zero gain on values of f which are not whole number multiples of 1/(16T) but are whole number multiples of 1/(272T), whereas the gain magnitude (sin $16^2\pi fT/\sin 16\pi fT$) in equation (16) has a finite value for such values of f. The periodic nature of the expressions in equations (5), (8), (12) and (19) are such that any frequency $(\alpha/T)$ which passes through to the output of the respective black box is shifted to the frequency $(\alpha/T)+(\beta/17T)$ by the subsequent sampling at 17T intervals where $\beta$ is any whole number between $+\infty$ and $-\infty$. Consequently, if $$\alpha = r/16T \quad (24)$$

then $$\frac{\alpha}{T} + \frac{\beta}{17T} = \frac{17r + 16\beta}{272T} \quad (25)$$

$$= \frac{\gamma}{272T}$$

where $\gamma$ is any whole number in the range $+\infty$ to $-\infty$. The desired values of $\gamma$ are those corresponding to the values of $\alpha/T$ in the input signal s(t). However, from equation (25)

$$\alpha = \frac{\gamma - 16\beta}{272} \quad (26)$$

$$= \frac{\mu}{272}$$

where $\mu$ is any whole number in the range $+\infty$ to $-\infty$. Consequently, if the respective black box allows a frequency to pass through which is a whole number multiple of 1/(272T), there will be a corresponding frequency at $\gamma/(272T)$ in the output after the 17T sampling operation.

Thus it can be seen that the embodiment of FIG. 2 is vulnerable to coherent interference, whereas the embodiment of FIG. 1 is not.

With a modification of the embodiment of FIG. 1 it is possible to obtain further averaging of the input signal. The modification consists in adding to the structure of FIG. 1 an extension of the delay line by a whole number multiple of the sixteen delay segments of delay T, and summing the respective signals from corresponding taps of the extended delay line. For example, a further sixteen segments of delay T may be added in series at the end of the line 10 of FIG. 1, and the signals at the output terminals of the delay segments' taps summed in pairs beginning with the signals at the tap 11 and the output tap of the first segment of the second sixteen delay segments and ending with the signals at the tap 26 and the output tap of the last segment of the second sixteen delay segments, and also summing the signals at the respective input terminals of the first segments of the line 10 and the second sixteen delay segments. A modification of this last example enables the embodiment to take advantage of half wave symmetry in a wanted input signal. For example if the wanted input signal is a sine wave, the delay segments can have a delay T such that 32T is the period of the wanted sine wave. It is then necessary merely to invert the values of one of the sets of seventeen signals from the delay line 10 and its extension. Furthermore a similar modification embodying the invention can be constructed by doubling the number of delay segments in the delay line 10 of the embodiment of FIG. 2, and this further modification will now be described with reference to FIGS. 3 and 4.

Figure 3:
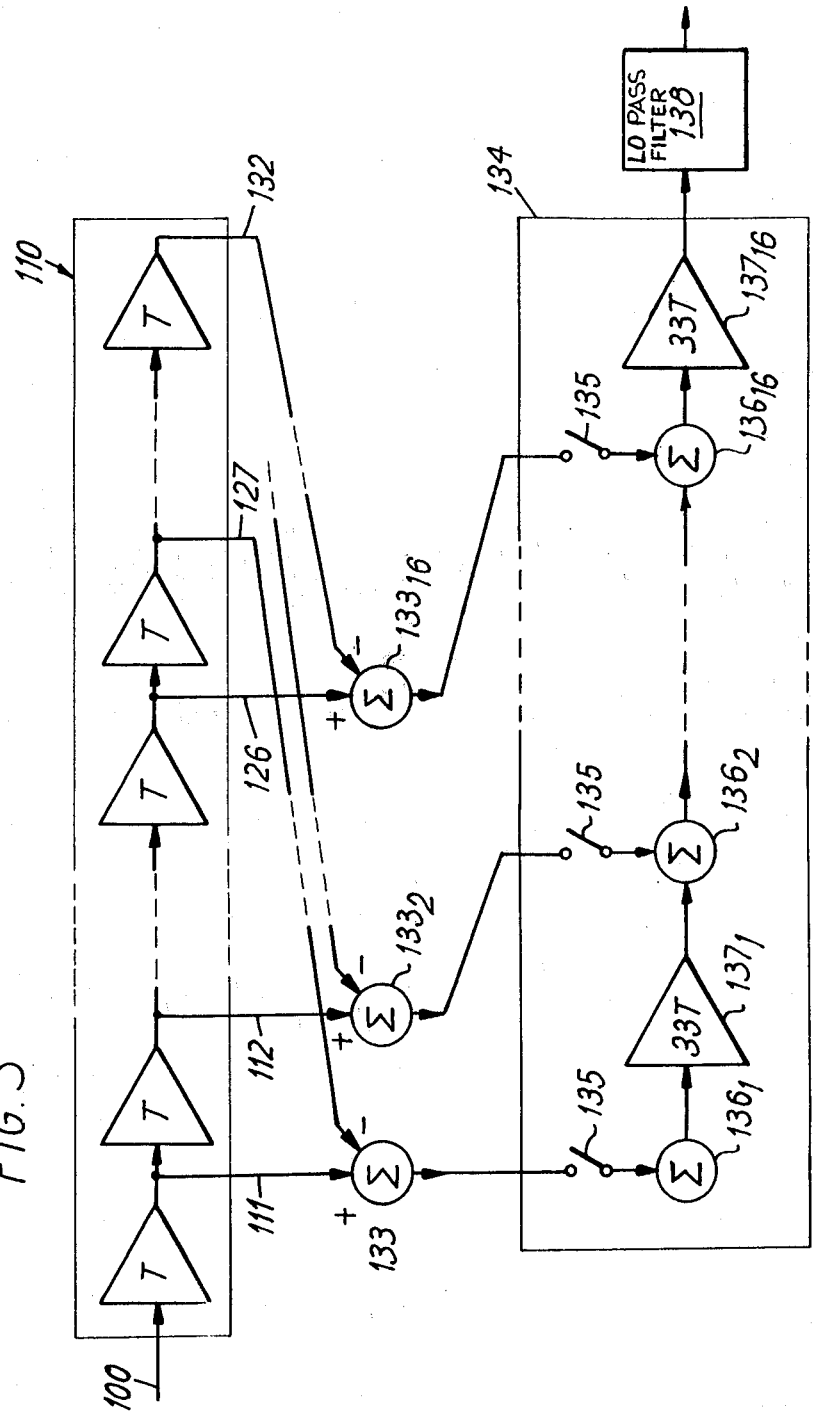
FIG. 3 is a schematic diagram of a further embodiment of the invention.

In FIG. 3 there is shown a delay line 110 having an input terminal 100, thirty-two segments each of delay T and thirty two taps 111 to 132. The taps are arranged in two groups of sixteen: taps 111 to 126 and taps 127 to 132. The taps 111 to 126 are connected to respective non-inverting input terminals of sixteen summers $133_1$ to $133_{16}$, and the taps 127 to 132 are connected to respective inverting input terminals of the sixteen summers $133_1$ to $133_{16}$ so that, from left to right in FIG. 3, the first summer $133_1$ is connected to the taps 111 and 127, the second summer $133_2$ is connected to the taps 112 and 128 (not shown), and so on up to the final summer $133_{16}$ which is connected to the taps 126 and 132. Consequently when the input terminal 100 of the line 110 is supplied with a periodic signal in which the signal values in the first half of each cycle are repeated with opposite polarity and in the same order in time in the second half of the cycle, and the period of the signal is 32T, the signals at the outputs of the summers $133_1$ to $133_{16}$ have the same waveform and period as the signal at the input terminal 100 but twice the magnitude, i.e. an averaging is thus effected.

The output terminals are connected to respective sampling switches 135 in a time delay and integrate block 134 which is connected to supply its output signal to a low pass filter 138. The block 134 corresponds to the block 32 of FIG. 2, having sixteen summers $136_1$ to $136_{16}$ and sixteen delay elements $137_1$ to $137_{16}$, except that the elements $137_1$ to $137_{16}$ have a delay of 33T, and the switches 135 are, in operation, simultaneously closed at intervals of 33T to sample the outputs of the summers $133_1$ to $133_{16}$, and when the signal in the delay line 110 is moved from one tap thereof to the next in response to clock pulses, the sampling by the switches 135 is synchronised with the clock pulses applied to the line 110.

Assuming the switches 135 to be closed the combination of the line 110 and the block 134 can be regarded as a linear time invariant black box with a transfer function H(Z) given in terms of the Z-transform by $$H(Z) = \sum_{m=1}^{16} (Z^{-1})^m (Z^{-33})^{17-m} - Z^{-16} \sum_{m=1}^{16} (Z^{-1})^m (Z^{-33})^{17-m} \quad (27)$$

$$= (1 - Z^{-16}) \sum_{m=1}^{16} (Z^{-1})^m (Z^{-33})^{17-m}$$

Hence, in complex operator terms, $$H(e^{j2\pi fT}) = 2je^{-j2\pi fT} \left[ (17) \left\{ \frac{32}{2} + 1 \right\} + 8 \right] (\sin 16\pi fT) \left[ \frac{\sin(32)(16)\pi fT}{\sin 32\pi fT} \right] \quad (28)$$

For values of f which are whole number multiples of 1/(32T), the term $$\left[ \frac{\sin(32)(6)\pi fT}{\sin 32\pi fT} \right]$$

is equal to 16. However, for even multiples of 1/(32T), sin $16\pi fT = 0$, and for odd multiples of 1/(32T), sin $16\pi fT = 1$. Consequently, assuming that the signal supplied at the input terminal 100 contains only the odd harmonics $f = \pm 1/32T$, $\pm 3/32T$, ... to $\pm 15/32T$ the black box gives a gain magnitude of 32.

Sampling such an input signal at 33T intervals results in the spectral lines at the output of the filter 138 being at the positions $\pm(1/1056T)$, $\pm(3/1056T)$, ... to $\pm(15/1056T)$, since $32 \times 33 = 1056$.

The signal to noise ratio is improved between the input terminal 100 and the output of the filter 138, which limits the frequency range to $-1/(66T)$ to $+1/(66T)$, by a factor of 32.

The equation corresponding to equation (26) is $$\alpha = (\gamma - 32\beta/1056) \quad (29)$$

where $\gamma$ is odd. The frequencies $\gamma/T$, $\beta/33T$, and $\gamma/1056T$ fall inside the Nyquist range for this embodiment.

The output sample stream from the block 134 can be represented by $$\{y(l32T)\} = 32\{s[(l-297)T]\} \quad (30)$$

A constructed example of the invention will now be described in more detail with reference to FIG. 4.

Figure 4:
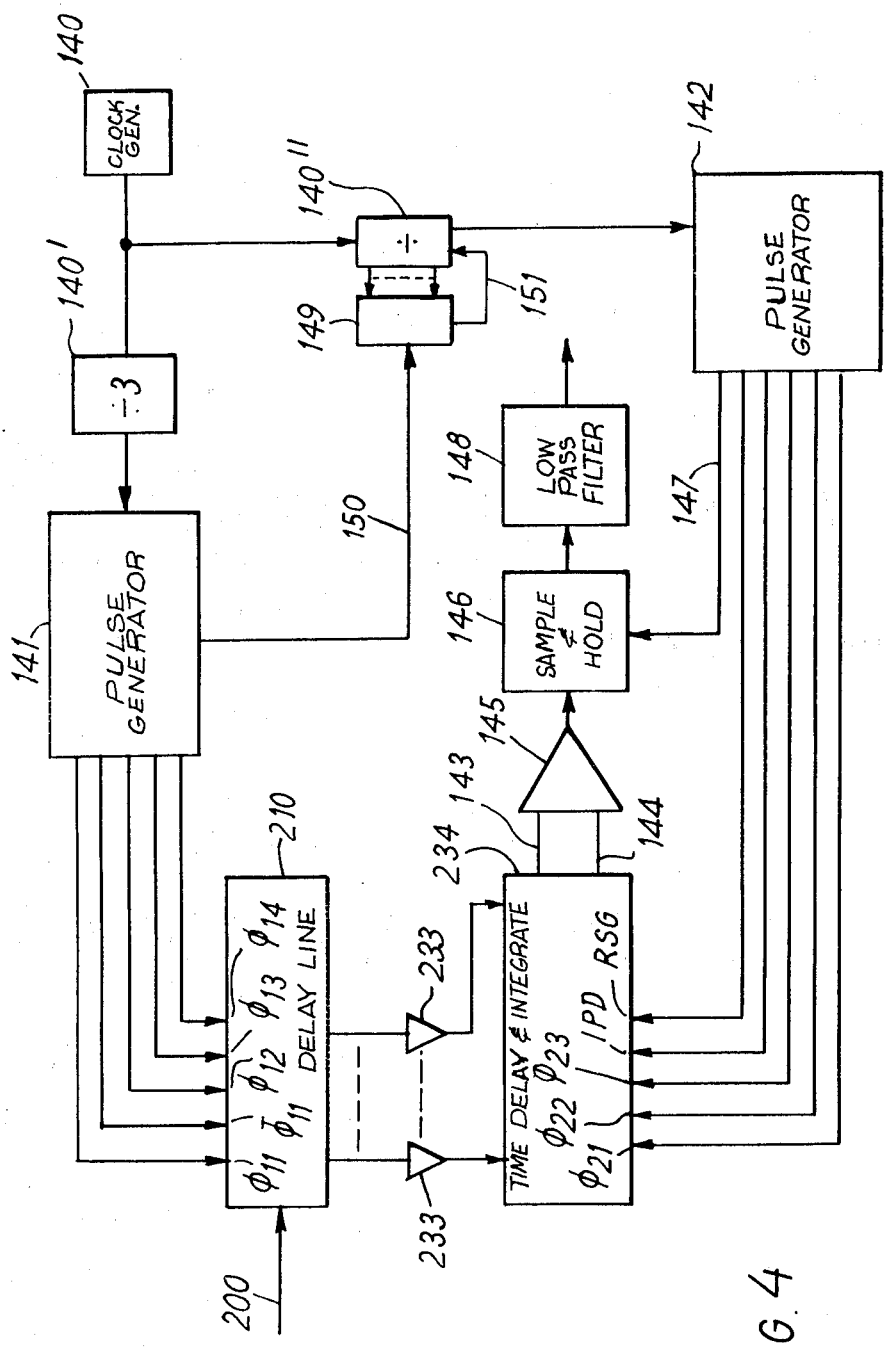
FIG. 4 is a block diagram of a practical embodiment of the invention.

In this example, as shown in FIG. 4 a sixteen segment delay line 210, which is provided by a Bell Northern CCT FO2 time delay line and requires for its operation five streams of pulses $\phi_{11}$, $\bar{\phi}_{11}$, $\phi_{12}$, $\phi_{13}$ and $\phi_{14}$ which are produced by a first pulse generator 141 supplied with divided down clock pulses from a clock generator 140 through a divide-by-three circuit 140'. The clock pulses are also supplied to a divider circuit 140" which feeds a second pulse generator 142 which produces six more streams of pulses, five of which: $\phi_{21}$, $\phi_{22}$, $\phi_{23}$, IPD and RSG, are supplied to the block 234 which is a time delay and integrate CCD as described in the aforementioned article in the Proceedings of the 3rd International Conference on Charge-Coupled Devices and a sixth of which through a connection 147, is supplied to a sample and hold circuit 146.

The two sets of five pulse streams operate the delay line 210 and the block 234 of FIG. 4 in accordance with either one of two modes depending upon the division effected by the divider circuit 140" and the sampling interval of the device 234.

The delay line 210 has fifteen taps and a final output connection each of which is connected to a respective input terminal of a summing stage of the device 234 as in the embodiment of FIG. 2 but with the interposition of a respective amplifier 233 which matches the output levels of the delay line 210 in the input levels of the device 234. The amplifiers 233 are conventional and need no further description for the man skilled in the art.

The device 234 has two output terminals 143 and 144. When an input signal at least including a periodic component having a suitable period is supplied to an input terminal 200 of the delay line 210, there appears at the output terminal 143 an averaged and stretched signal superposed on a clock waveform which is characteristic of the device 234. The output terminal 144 provides a signal which is solely the said characteristic clock waveform without the averaged and stretched signal and is in phase with the clock waveform at the terminal 143. The two terminals 143 and 144 are connected respectively to the input terminals of a conventional differential amplifier 145 which consequently operates to remove some of the clock waveform from the signal supplied from the terminal 143. The remaining clock waveform component is removed by the sample and hold circuit 146 whose output is supplied to a low pass filter 148. The sample and hold circuit 146 and the low pass filter 148 are conventional and require no further description.

The necessary timing relationship between the operation of the device 234 and that of the delay line 210 is obtained by synchronisation of the divider circuit 140". The divider circuit 140" is a conventional pulse counter connected to receive the clock pulses from the clock generator 140. The number by which the circuit 140" divides is determined by the choice of stage of the counter as output stage to be connected to the second pulse generator 142. The counter has an inhibit input connection 151 such that when an inhibit signal appears thereon, the final count on the circuit 140" is frozen. The actual count in the circuit 140" is sensed by a comparator 149 and compared thereby with a synchronising signal which the comparator 149 receives on an output connection 150 of the first pulse generator 141. If the comparison indicates that the timing relationship of the next output pulse to be produced by the divider circuit 140" will be correct, the comparator 149 does not supply an inhibit signal to the inhibit input connection 151 of the circuit 140". If, however, the comparison does not indicate that the timing relationship of the next output pulse to be produced by the circuit 140" will be correct, then an inhibit signal is supplied on the connection 150 until the correct time for emission of the next output pulse of the circuit 140", as indicated by the synchronising signal on the connection 150, has arrived whereupon the inhibit signal is removed and the circuit 140" unfrozen. The circuit 140" will then emit its pulse and continue operation in the correct time relation thereafter.

The comparator 149 is a conventional logic signal comparator composed of logic gates and flip flops and will require no further description for the man skilled in the art.

The first pulse generator 141 is conventional pulse dividing and shaping circuitry which needs no further detailed description. The waveforms produced thereby in response to the stream of pulses supplied thereto by the divide by three circuit 140' are all except $\bar{\phi}_{11}$ shown in FIG. 5. The waveform $\phi_{11}$ is a square wave of period T and has a logic one time of $(T/2+40$ nanoseconds). The waveform $\bar{\phi}_{11}$, not shown, is the inversion of $\phi_{11}$. The waveform $\phi_{12}$ is a square wave of period T and has a logic one time of $(T/2+80$ nanoseconds). The intervals between the edges of $\phi_{11}$ and those of $\phi_{12}$ are shown in nanoseconds in FIG. 5. The logic one levels in $\phi_{11}$, $\bar{\phi}_{11}$ and $\phi_{12}$ are 11 volts above their logic zero levels.

The $\phi_{13}$ waveform consists of 80 nanosecond pulses of height 14 volts at intervals of T, and the $\phi_{14}$ waveform consists of 100 nanosecond pulses of height 11 volts at intervals T. The rising edges of the $\phi_{14}$ pulses are coincident with the falling edges of the $\phi_{13}$ pulses and those of the $\phi_{12}$ waveform.

Figure 5:
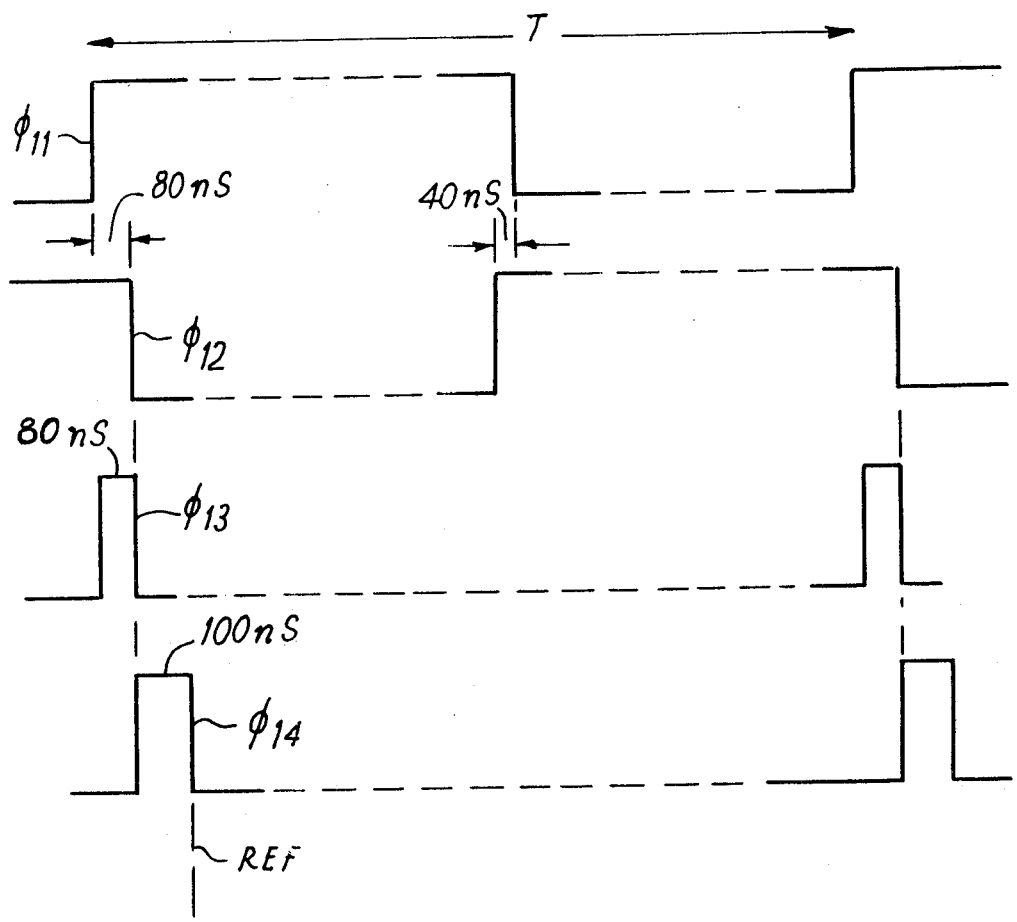

The falling edge of selected ones of the $\phi_{14}$ pulses serve as a reference time, indicated as REF in FIGS. 5 and 6 for the waveforms generated by the second generator 142 relative to those generated by the first generator 141. This reference time is used to develop the synchronising signal supplied on the connection 150 and thus to establish the correct timing relationship between the operation of the device 234 and the delay line 210.

FIG. 6 shows the waveforms generated by the second generator 142 which again is conventional pulse dividing and shaping circuitry which needs no further description. The waveform $\phi_{21}$ is a square wave having a period corresponding to the delay of each individual delay device, such as 30, in FIG. 2, of the device 234. In FIG. 6 this period is shown as 16T and to obtain such a period the circuit 140" is arranged to divide by 32. The logic one time of $\phi_{21}$ is $(16T/3+150$ nanoseconds). The waveforms $\phi_{22}$ and $\phi_{23}$ have the same period and mark space ratio as $\phi_{21}$ and are phased as shown in FIG. 6 with 150 nanosecond intervals between adjacent edges so that the logic one times of $\phi_{22}$ and $\phi_{23}$ overlap each other and the logic one time of $\phi_{21}$, and are present, or at least one or the other is, during the logic zero time of $\phi_{21}$.

The waveform IPD, supplied to the terminal known as "input diode" of the device 234, is a square waving having its rising edges 200 nanoseconds after the reference time REF which is the time of falling edges of selected pulses of $\phi_{14}$. The period of IPD is 16T, and the rising edges in $\phi_{22}$ are timed to occur 700 nanoseconds after the rising edges in IPD. The rising edges of $\phi_{23}$ occur 150 nanoseconds before the falling edges of $\phi_{22}$, and the falling edges of IPD occur 710 nanoseconds before the rising edges of $\phi_{23}$. The waveform RSG, supplied to the terminal known as "reset gate" of the device 234, has the same period and mark space ratio as IPD, and occurs 1000 nanoseconds later.

The sample and hold signal on connection 147 is a square wave of period 16T whose falling edges occur 10 microseconds after the falling edges of $\phi_{23}$ and whose logic zero time is 5 microseconds. The sample and hold circuit thus samples for 5 microseconds and holds for the remainder of 16T.

The period T of the waveforms $\phi_{11}$ to $\phi_{14}$ corresponds to six periods of the clock generator 140, the divide-by-three counter 140' providing the first generator 141 with a square wave of period T/2, and this square wave being divided by two in the generator 141 to produce $\phi_{11}$ and $\bar{\phi}_{11}$.

The generator 142 divides the square wave constituted by the train of output pulses from the circuit 140" by three to obtain, with further slight timing adjustments for the desired overlaps of 150 nanoseconds the three waveforms $\phi_{21}$, $\phi_{22}$ and $\phi_{23}$. Consequently the period of these waveforms $\phi_{21}$, $\phi_{22}$ and $\phi_{23}$, corresponds to $32\times 3=16\times 6$ periods of the clock generator 140.

With such timing, the embodiment of FIG. 4 operates on an input signal containing a periodic component of period 15T in the manner explained hereinbefore for a buffered version of the FIG. 1 embodiment i.e. with the delay in samples at the final output terminal of the filter 148 being $(N+1)^2/2$ where N is 15 since the first delay segment of the line 210 acts merely as a buffer. This is the preferred mode of operation. However if the divider circuit 140" is arranged to divide by 34, the period of the waveforms $\phi_{21}$, $\phi_{22}$, $\phi_{23}$, IPD, RSG, and the sample and hold waveform becomes 17T and the embodiment of FIG. 4 operates as described hereinbefore with reference to FIG. 2.

In yet another embodiment of the invention, there may be means for delaying a periodic input by a plurality of different delay times and for recombining the differently delayed portions of the input, this means comprising a transversal filter and being coupled to means, such as a suitably clocked charge-coupled delay device, for sampling the said delayed portions to produce an averaged and time stretched representation of the said input.

It should of course be understood that where, in referring to the delays in the embodiments described hereinbefore, a time T is specified, this time T can preferably be changed. Thus one embodiment with variable T can be used to process different periodic signals having different fundamental periods. For example, a useful range of values of T is from 10 microseconds to 2 milliseconds. In particular, in those embodiments where the delays are implemented by means of devices which accept a new input signal and emit a stored signal value in response to a pulse, the value of T can be changed by changing the rate at which actuating pulses are supplied to the devices.

In the embodiment of FIG. 4, a typical value of frequency for the clock pulse generator 140 is in the range 300 kilohertz to 1 megahertz. The corresponding range of input signal frequency which can then be averaged and stretched, using the embodiment with the divider circuit 140" dividing by 32, is approximately 3.3 kilohertz to 11 kilohertz.

We claim:

1. Signal processing apparatus for processing a periodic input signal, the apparatus comprising:
   (a) common input terminal means to which said periodic input signal is applied;
   (b) common output terminal means;
   (c) a plurality of different delay paths coupling said common input terminal means to said common output terminal means, said different delay paths having respective different delays differing by a whole number multiple of the period of said periodic input signal;
   (d) a plurality of signal summing means included in said delay paths and arranged such that at least some of said delay paths have portions in common with one another downstream of the respective summing means;
   (e) sampling means in each said delay path; and
   (f) clock means coupled to said sampling means for driving said sampling means at a sampling interval which is greater than said period and is a non-integer multiple of said period.

2. Apparatus as claimed in claim 1, wherein said summing means, said sampling means, and said downstream portions of said delay paths are formed at least in part by a time delay and integrate charge coupled device.

3. Apparatus as claimed in claim 1, wherein said delay paths include a tapped delay line.

4. Apparatus as claimed in claim 3, wherein said tapped delay line comprises a series of devices each of which is actuated by a pulse in response to which said device accepts a new signal value and emits a stored signal value, and means are provided for supplying said tapped delay line with actuating pulses at such a rate that new signal values are sampled from said periodic input at at least the Nyquist rate.

5. A method of processing a signal containing a periodic component, the method comprising the steps of:
   delaying said signal by a plurality of different delays differing from one another by a whole number multiple of the period of said periodic component;
   recombining differently delayed portions of said signal arriving simultaneously at a point; and
   sampling said differently delayed portions at a sampling interval which is greater than the period of said periodic component.

6. A method as claimed in claim 5, wherein said delaying step is effected in two parts and said sampling step is effected between said two parts of said delaying step.

7. A method as claimed in claim 6, wherein said delaying and sampling steps comprise charging and discharging a plurality of interconnected charge coupled devices.

8. Signal processing apparatus comprising:
   input terminal means;
   tapped delay line means having input end means coupled to said input terminal means and having a plurality of taps and an output end means;
   a plurality of sampling means each coupled respectively to said taps and output end means;
   final output summing means coupled to said sampling means; and
   further delay means coupling those of said sampling means which are coupled to said taps to said final output summing means, said sampling means sampling at an interval which is greater than the total delay through said tapped delay line means and is a non-integer multiple of said total delay, and said further delay means cooperating with said delay line means to provide a plurality of different signal paths from said input end to said final summing means, said different signal paths differing from one another by whole number multiples of said total delay.

9. Apparatus as claimed in claim 8, wherein said further delay means comprise a series of delay devices coupled to one another in the series by intermediate summing means, each intermediate summing means having input terminal means coupled to a respective tap of said delay line means, further input terminal means, and output terminal means, said further input terminal means being coupled to the output terminal means of another one of said delay devices in said series, and said output terminal means being coupled to the input terminal means of the next delay device in said series.

10. Apparatus as claimed in claim 9, wherein said series of delay devices includes a first delay device with input terminal means coupled to said input end of said delay line means.

11. Apparatus as claimed in claim 8, further including interpolating means coupled to said final output summing means.

12. Apparatus as claimed in claim 11, wherein said interpolating means comprises a low-pass filter.

13. Apparatus as claimed in claim 8, wherein said tapped delay line means comprises a tapped charge-coupled delay line, and said sampling means and said further delay means include a time delay and integrate charge-coupled device.

* * * * *